US012764857B2

(12) United States Patent
Shimizu et al.

(10) Patent No.: US 12,764,857 B2
(45) Date of Patent: Oct. 13, 2026

(54) WIRING SUBSTRATE

(71) Applicant: IBIDEN CO., LTD., Ogaki (JP)

(72) Inventors: Keisuke Shimizu, Ogaki (JP); Fumio Nishiwaki, Ogaki (JP); Ryoya Kimura, Ogaki (JP)

(73) Assignee: IBIDEN CO., LTD., Ogaki (JP)

(*) Notice: Subject to any disclaimer, the term of this patent is extended or adjusted under 35 U.S.C. 154(b) by 182 days.

(21) Appl. No.: 18/408,617

(22) Filed: Jan. 10, 2024

(65) Prior Publication Data

US 2024/0237203 A1 Jul. 11, 2024

(30) Foreign Application Priority Data

Jan. 11, 2023 (JP) ................................ 2023-002653

(51) Int. Cl.

*H05K 1/02* (2006.01)
*H05K 3/46* (2006.01)
*H10W 70/05* (2026.01)
*H10W 70/60* (2026.01)
*H10W 70/65* (2026.01)
*H05K 1/03* (2006.01)

(52) U.S. Cl.

CPC ......... *H05K 1/0298* (2013.01); *H05K 3/4644* (2013.01); *H10W 70/05* (2026.01); *H10W 70/611* (2026.01); *H10W 70/65* (2026.01); *H05K 1/036* (2013.01); *H05K 2201/0266* (2013.01)

(58) Field of Classification Search

CPC ................. H05K 1/0298; H05K 1/036; H05K 2201/0266; H05K 1/02; H05K 1/03; H05K 1/0306; H05K 1/144; H01L 23/5386

USPC .......................................................... 174/250

See application file for complete search history.

(56) References Cited

U.S. PATENT DOCUMENTS

2011/0088933 A1* 4/2011 Amou .................... H05K 3/385 174/257
2017/0098600 A1* 4/2017 Sakai .................... H01L 25/105
2020/0389969 A1* 12/2020 Ikeda ..................... H05K 1/025
2021/0185807 A1* 6/2021 Nagai .................... H05K 1/036
2024/0172373 A1* 5/2024 Kim ...................... H05K 3/4661
2024/0215165 A1* 6/2024 Jung .................... H05K 3/4652

FOREIGN PATENT DOCUMENTS

JP 2014-225632 A 12/2014

* cited by examiner

*Primary Examiner* — Timothy J Thompson
*Assistant Examiner* — Sidi M Maiga
(74) *Attorney, Agent, or Firm* — Finnegan, Henderson, Farabow, Garrett & Dunner, LLP

(57) ABSTRACT

A wiring substrate includes a first wiring part including a first insulating layer and a first conductor layer laminated on the first insulating layer, and a second wiring part formed on the first part and including a second insulating layer and a second conductor layer laminated on the second insulating layer. The thickness of the second insulating layer is smaller than that of the first insulating layer. The thickness of the second conductor layer is smaller than that of the first conductor layer. The first conductor layer has a surface on the opposite side with respect to the first insulating layer such that the arithmetic mean roughness of the surface is smaller than that of a surface of the second conductor layer on the opposite side with respect to the second insulating layer. The second part is positioned closer to the outermost surface of the substrate than the first part.

20 Claims, 5 Drawing Sheets

WIRING SUBSTRATE

CROSS-REFERENCE TO RELATED APPLICATIONS

The present application is based upon and claims the benefit of priority to Japanese Patent Application No. 2023-002653, filed Jan. 11, 2023, the entire contents of which are incorporated herein by reference.

BACKGROUND OF THE INVENTION

Field of the Invention

The present invention relates to a wiring substrate.

Description of Background Art

Japanese Patent Application Laid-Open Publication No. 2014-225632 describes a wiring substrate including a high-density wiring layer and a low-density wiring layer. The entire contents of this publication are incorporated herein by reference.

SUMMARY OF THE INVENTION

According to one aspect of the present invention, a wiring substrate includes a first wiring part including a first insulating layer and a first conductor layer laminated on the first insulating layer, and a second wiring part formed on the first wiring part and including a second insulating layer and a second conductor layer laminated on the second insulating layer such that the thickness of the second insulating layer is smaller than the thickness of the first insulating layer and that the thickness of the second conductor layer is smaller than the thickness of the first conductor layer. The first conductor layer in the first wiring part has a surface on the opposite side with respect to the first insulating layer such that the arithmetic mean roughness of the surface is smaller than an arithmetic mean roughness of a surface of the second conductor layer on the opposite side with respect to the second insulating layer, and the second wiring part is formed such that the second wiring part is positioned closer to the outermost surface of the wiring substrate than the first wiring part.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
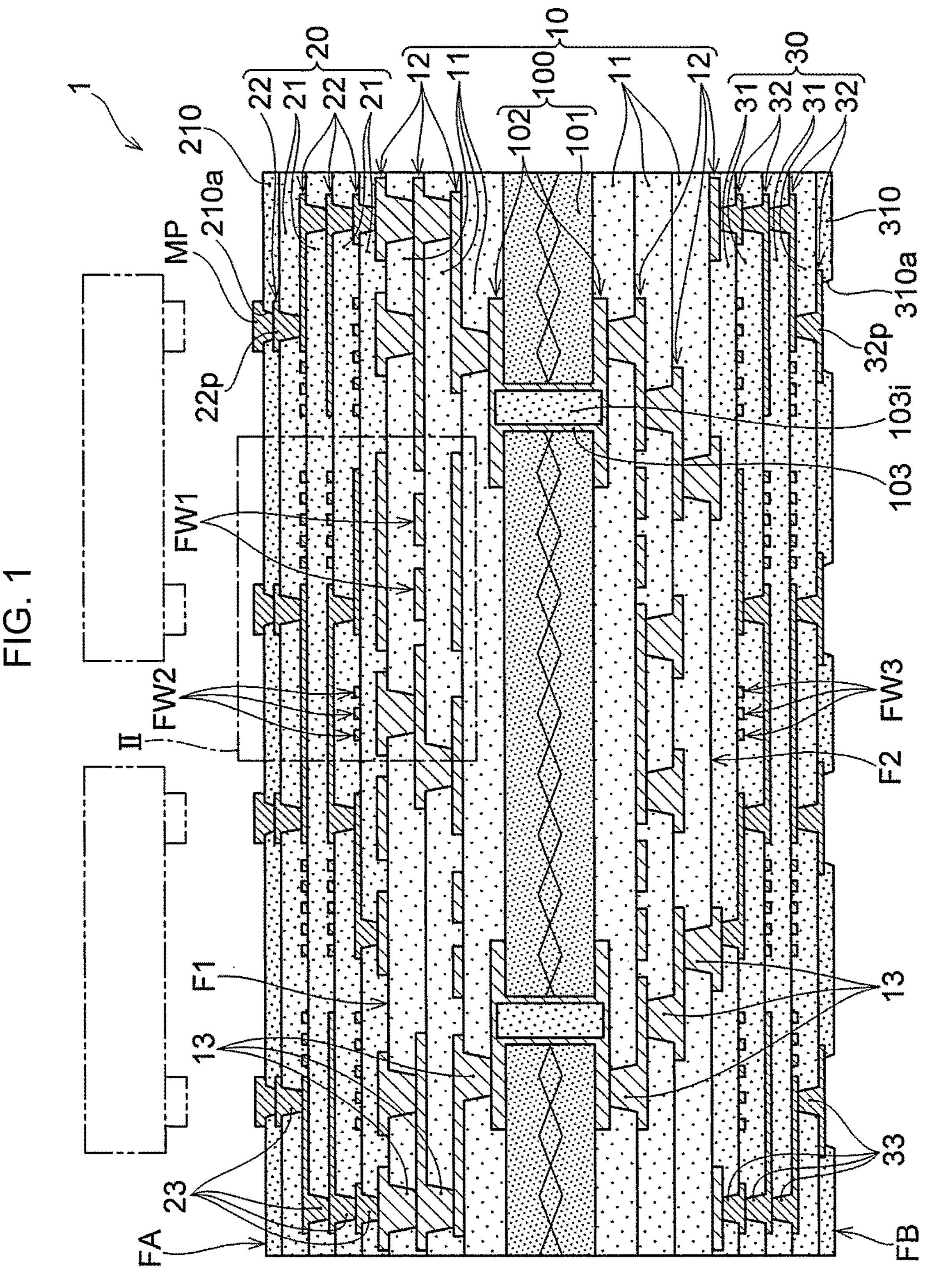
FIG. 1 is a cross-sectional view illustrating an example of a wiring substrate according to an embodiment of the present invention.

Embodiments will now be described with reference to the accompanying drawings, wherein like reference numerals designate corresponding or identical elements throughout the various drawings.

FIG. 1 illustrates a cross-sectional view of a wiring substrate 1 as an example of a structure of a wiring substrate according to an embodiment of the present invention.

The wiring substrate 1 in the example illustrated in FIG. 1 includes a first wiring part 10, a second wiring part 20, and a third wiring part 30. The first wiring part 10 has a core substrate 100 that includes an insulating layer (core insulating layer) 101 and conductor layers (core conductor layers) 102, which are respectively formed on both sides of the core insulating layer 101. On each of both sides of the core substrate 100, insulating layers 11 and conductor layers 12 are alternately laminated.

On an upper side of a surface (F1) on one side of the first wiring part 10 (opposite side with respect to the core substrate 100), the second wiring part 20 is formed in which multiple insulating layers 21 and multiple conductor layers 22 are alternately laminated. On an upper side of a surface (F2) on the other side of the first wiring part 10 (opposite side with respect to the core substrate 100), the third wiring part 30 is formed in which multiple insulating layers 31 and multiple conductor layers 32 are alternately laminated. In the illustrated example, the first wiring part 10 forms an inner-layer part of the wiring substrate 1, and the second wiring part 20 and the third wiring part 30 each form a surface-layer part of the wiring substrate 1. That is, the second wiring part 20 and the third wiring part 30 are positioned closer to outer sides of the wiring substrate 1 than the first wiring part 10.

In the description of the illustrated wiring substrate 1, a side farther from the core insulating layer 101 is referred to as "upper," "upper side," "outer side," or "outer," and a side closer to the core insulating layer 101 is referred to as "lower," "lower side," "inner side," or "inner." Further, for each of the structural components, a surface facing the opposite side with respect to the core substrate 100 is also referred to as an "upper surface," and a surface facing the core substrate 100 side is also referred to as a "lower surface." Therefore, in the description of each of the elements of the wiring substrate 1, a side farther from the core substrate 100 is also referred to as an "upper side," "upper-layer side," or "outer side," or simply "upper" or "outer," and a side closer to the core substrate 100 is also referred to as a "lower side," "lower-layer side," or "inner side," or simply "lower" or "inner."

The insulating layers 11 of the first wiring part 10 are also referred to as first insulating layers 11, and the conductor layers 12 of the first wiring part 10 are also referred to as first conductor layers 12. The first conductor layers 12 are respectively laminated on the first insulating layers 11. The insulating layers 21 of the second wiring part 20 are also referred to as second insulating layers 21, and the conductor layers 22 of the second wiring part 20 are also referred to as second conductor layers 22. The second conductor layers 22 are respectively laminated on the second insulating layers 21. The insulating layers 31 of the third wiring part 30 are also referred to as third insulating layers 31, and the conductor layers 32 of the third wiring part 30 are also referred to as third conductor layers 32. The third conductor layers 32 are respectively laminated on the third insulating layers 31. The second wiring part 20 is formed of the second insulating layers 21 and the second conductor layers 22, and the third wiring part 30 is formed of the third insulating layers 31 and the third conductor layers 32.

In particular, in the second wiring part 20, the conductor layers 22 are provided at a relatively high density. Specifically, a thickness of each of the second insulating layers 21 of the second wiring part 20 is smaller than a thickness of each of the first insulating layers 11 of the first wiring part 10, and a thickness of each of the second conductor layers 22 of the second wiring part 20 is smaller than a thickness of each of the first conductor layers 12 of the first wiring part 10. For example, a maximum thickness of each of the second insulating layers 21 can be 18 μm or less, and a minimum thickness of each of the first insulating layers 11 can be 19 μm or more. For example, a maximum thickness of each of the second conductor layers 22 can be 11 μm or less, and a minimum thickness of each of the first conductor layers 12 can be 12 μm or more. Further, the second conductor layers 22 can include, as conductor patterns thereof, patterns with relatively small inter-conductor distances. The second conductor layers 22 can include, as conductor patterns thereof, wirings with inter-conductor distances smaller than a minimum inter-conductor distance of conductor patterns in the first conductor layers 12.

In the illustrated example, in the third wiring part 30 provided on the first wiring part 10 on the opposite side with respect to the second wiring part 20, the third insulating layers 31 and the third conductor layers 32 have similar structures to the second insulating layers 21 and the second conductor layers 22 described above. Therefore, in the following, as a description of a surface-layer part of the wiring substrate 1, the structure of the second wiring part 20 is mainly described, and a detailed description of the third wiring part 30 is omitted.

In the insulating layer 101 of the core substrate 100, through-hole conductors 103 are formed that penetrate the insulating layer 101 in a thickness direction and connect the conductor layers 102 that are respectively formed on both sides of the insulating layer 101. Insides of the through-hole conductors 103 are each filled with a resin body (103*i*) containing an epoxy resin or the like. In the first insulating layers 11, the second insulating layers 21, and the third insulating layers 31, via conductors (13, 23, 33) are respectively formed connecting the conductor layers separated by the first-third insulating layers (11, 21, 31).

In the illustrated example, on an outer side of the second wiring part 20 (on the opposite side with respect to the first wiring part 10), a covering insulating layer 210 is further formed covering the second conductor layer 22 and the second insulating layer 21 exposed from the conductor patterns of the second conductor layer 22. On an outer side of the third wiring part 30 (on the opposite side with respect to the first wiring part 10), a covering insulating layer 310 is further formed covering the third conductor layer 32 and the third insulating layer 31 exposed from the conductor patterns of the third conductor layer 32. The covering insulating layers (210, 310) can be, for example, solder resist layers forming outermost insulating layers of the wiring substrate 1.

Openings (210*a*) are formed in the covering insulating layer 210, and conductor pads (22*p*) are exposed in the openings (210*a*). The openings (210*a*) are through holes penetrating the covering insulating layer 210 in the thickness direction, and the openings (210*a*) are filled with conductors. The conductors filling the openings (210*a*) form an outermost surface of the wiring substrate 1 and form connection elements (MP), which are, for example, metal posts that can be used to connect the wiring substrate 1 to an external electronic component. Openings (310*a*) are formed in the covering insulating layer 310, and conductor pads (32*p*) of the outermost third conductor layer 32 in the third wiring part 30 are exposed from the openings (310*a*).

Among the multiple second conductor layers 22 of the second wiring part 20, the outermost second conductor layer 22 is formed in a pattern having the multiple conductor pads (22*p*). In the illustrated example, connection elements (MP), which are structural elements formed of conductors, are respectively formed on the conductor pads (22*p*). The connection elements (MP) can be used for connecting to connection pads of an external electronic component when the wiring substrate 1 is used. Upper surfaces of the connection elements (MP) can be electrically and mechanically connected to an external electronic component, for example, via a conductive bonding material such as solder (not illustrated) provided between the connection elements (MP) and connection pads of the external electronic component. That is, a first surface (FA), which is formed of exposed surfaces of the connection elements (MP) and an upper surface of the covering insulating layer 210 and is an outermost surface of the wiring substrate 1, can be a component mounting surface to which an external electronic component can be connected when the wiring substrate 1 is used.

Examples of electronic components that can be mounted on the wiring substrate 1 include electronic components (for example, logic chips and memory elements) such as active components such as semiconductor integrated circuit devices and transistors. A second surface (FB) on the opposite side with respect to the first surface (FA) is formed of an exposed surface of the covering insulating layer 310 on an outermost side of the third wiring part 30 and upper surfaces of the conductor pads (32*p*) exposed from the openings (310*a*). The second surface (FB) can be a connection surface to be connected to an external element such as an external wiring substrate (for example, a motherboard of any electrical device) when the wiring substrate 1 itself is mounted on the external element. The conductor pads (32*p*) can be connected to any substrate, electronic component, mechanism element, or the like.

The insulating layers (101, 11, 21, 31) of the wiring substrate 1 can each be formed, for example, using an insulating resin such as an epoxy resin or a phenol resin. A fluorine resin, a liquid crystal polymer (LCP), a fluoroethylene resin (PTFE), a polyester resin (PE), or a modified polyimide resin (MPI) also may be used for the insulating layers (101, 11, 21, 31). The insulating layers (101, 11, 21, 31) may each contain a reinforcing material (core material) such as a glass fiber. The insulating layers (101, 11, 21, 31) can contain inorganic filler particles such as silica or alumina particles. The covering insulating layers (210, 310), which can be solder resist layers, can each be formed using, for example, a photosensitive epoxy resin or polyimide resin, or the like.

As will be described in detail later with reference to FIG. 2, the second insulating layers 21 of the second wiring part 20 are formed such that the upper surfaces thereof (the surfaces on which the second conductor layers 22 are respectively laminated) have relatively small surface roughness. The surface roughness of the upper surfaces of the second insulating layers 21 is smaller than the surface roughness of the upper surfaces of the first insulating layers 11 (the surfaces on which the first conductor layers 12 are respectively laminated) of the first wiring part 10. The first insulating layers 11 and the second insulating layers 21 can be different in relative permittivity and dielectric loss tangent. Further, when the second insulating layers 21 contain inorganic filler particles, dimensions of the inorganic filler particles contained in the second insulating layers 21 can be different from dimensions of inorganic filler particles that can be contained in the first insulating layers 11.

The conductor layers (102, 12, 22, 32), the via conductors (13, 23, 33), the through-hole conductors 103, and the connection elements (MP) can be formed using any metal such as copper or nickel, and, for example, can each be formed of a metal foil such as a copper foil and/or a metal film formed by plating or sputtering or the like. The conductor layers (102, 12, 22, 32), the via conductors (13, 23, 33), the through-hole conductors 103, and the connection elements (MP) are each illustrated in FIG. 1 as having a single-layer structure, but can each have a multilayer structure that includes two or more metal layers. For example, the conductor layers 102 that are respectively formed on the surfaces of the insulating layer 101 can each have a five-layer structure including a metal foil layer (preferably, a copper foil), an electroless plating film layer (preferably, an electroless copper plating film), and an electrolytic plating film layer (preferably, an electrolytic copper plating film). Further, the conductor layers (12, 22, 32), the via conductors (13, 23, 33), the through-hole conductors 103, and the connection elements (MP) can each have, for example, a two-layer structure including a metal film layer, which is an electroless plating film or a sputtering film, and an electrolytic plating film layer.

The conductor layers (102, 12, 22, 32) of the wiring substrate 1 are each patterned to have predetermined conductor patterns. In the illustrated example, among the multiple first conductor layers 12 included in the first wiring part 10, any first conductor layer 12 includes first wirings (FW1). Among the multiple second conductor layers 22 included in the second wiring part 20, any second conductor layer 22 includes second wirings (FW2). Among the multiple third conductor layers 32 included in the third wiring part 30, any third conductor layer 32 includes third wirings (FW3). In particular, the wirings (FW2) that can be included in the second wiring part 20 can be formed as finer wirings than the wirings (FW1) that can be included in the first wiring part 10. A minimum wiring width of the second wirings (FW2) can be smaller than a minimum wiring width of the first wirings (FW1). Further, a minimum inter-wiring distance of the wirings (FW2) can be smaller than a minimum inter-wiring distance of the first wirings (FW1). The second wiring part 20 can include the second wirings (FW2) that have the smallest wiring width and inter-wiring distance among the wirings that can be included in the conductor layers of the wiring substrate 1. The first wirings (FW1) that can be included in the first wiring part 10 can be formed as wirings responsible for carrying high frequency signals.

Further, as will be described in detail later with reference to FIG. 2, upper surfaces of the first conductor layers 12 of the first wiring part 10 (surfaces on opposite sides with respect to the surfaces of the first insulating layers 11 on which the first conductor layers 12 are laminated, respectively) are formed to have relatively small surface roughness. The surface roughness of the upper surfaces of the first conductor layers 12 is smaller than the surface roughness of the upper surfaces of the second conductor layers 22 of the second wiring part 20 (the surfaces on opposite sides with respect to the surfaces of the second insulating layers 21 on which the second conductor layers 22 are laminated, respectively).

Figure 2:
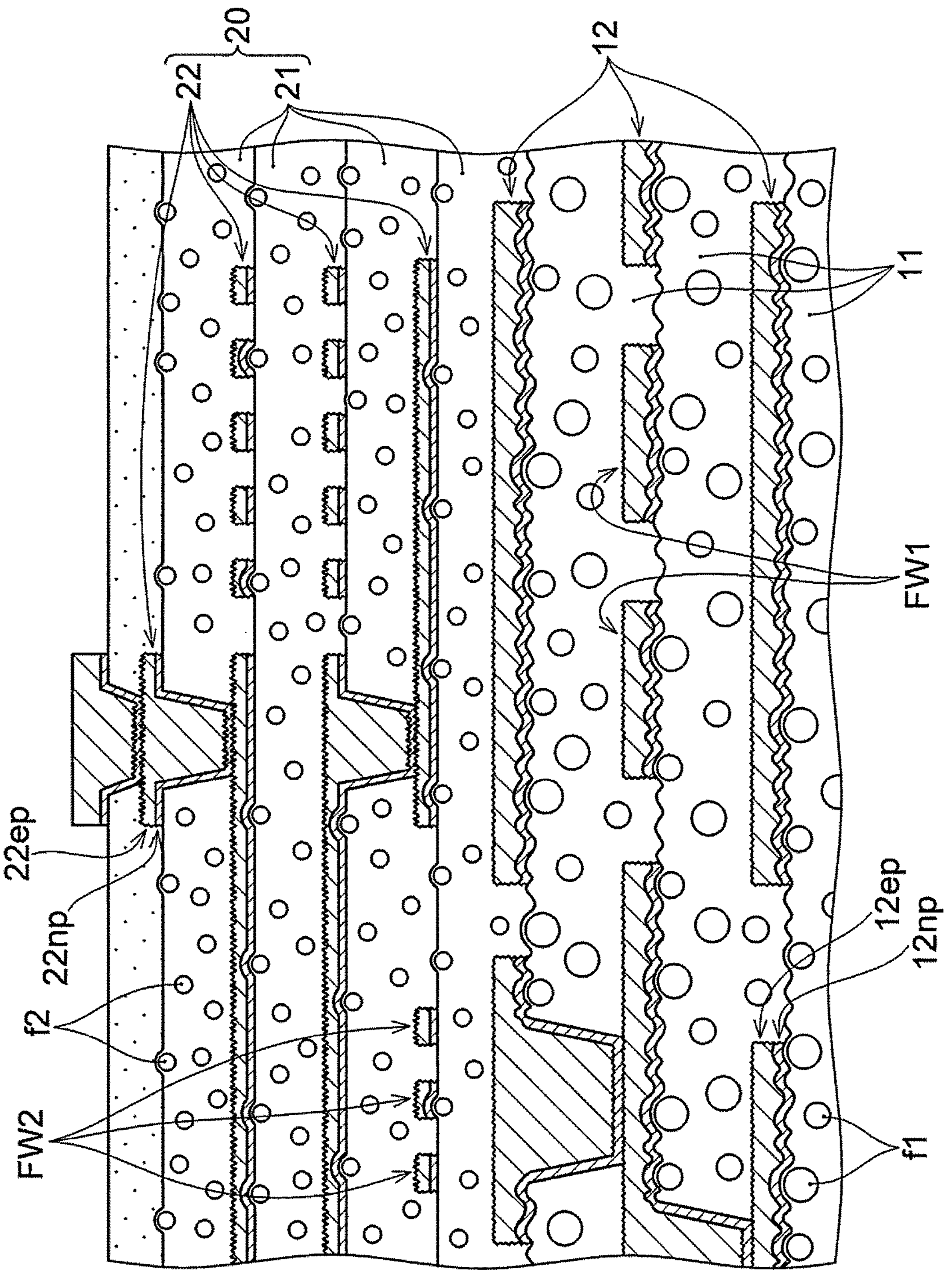
FIG. 2 is a partial enlarged view of FIG. 1 illustrating an example of a wiring substrate according to an embodiment of the present invention.

Next, with reference to FIG. 2, the second insulating layers 21 and the second conductor layers 22 of the second wiring part 20, and the first insulating layers 11 and the first conductor layers 12 of the first wiring part 10, are described in detail. FIG. 2 is an enlarged view of a region (II) surrounded by a one-dot chain line in FIG. 1.

As illustrated, the second insulating layers 21 of the second wiring part 20 are formed such that the surface roughness of the upper surfaces thereof is relatively small. An arithmetic mean roughness of the upper surfaces of the second insulating layers 21 is smaller than an arithmetic mean roughness of the upper surface of the first insulating layers 11. Specifically, for example, the arithmetic mean roughness of the upper surfaces of the first insulating layers 11 can be 0.15 μm or more, and the arithmetic mean roughness of the upper surfaces of the second insulating layers 21 can be 0.13 μm or less. Since the arithmetic mean roughness of the upper surfaces of the second insulating layers 21 is relatively small, the second conductor layers 22 that are respectively laminated on the upper surfaces of the second insulating layers 21 can each have a relatively uniform thickness. Therefore, insertion loss of a signal carried by the second conductor layers 22 (specifically, the second wirings (FW2)) can be kept small. It is thought that relatively good signal transmission can be achieved in the second wiring part 20.

As illustrated, the first conductor layers 12 and the second conductor layers 22 can each have a multilayer structure including a metal film layer and an electrolytic plating film layer. In the illustration, the first conductor layers 12 each include a metal film layer (12*np*) and an electrolytic plating film layer (12*ep*), and the second conductor layers 22 each include a metal film layer (22*np*) and an electrolytic plating film layer (22*ep*). The metal film layer (12*np*) included in each of the first conductor layers 12 can be an electroless copper plating film layer formed by electroless plating or a sputtering film layer formed by sputtering using copper as a target. The electrolytic plating film layer (12*ep*) can be an electrolytic copper plating film layer formed using the metal film layer (12*np*) as a power feeding layer. The metal film layer (22*np*) of each of the second conductor layers 22 can be an electroless copper plating film layer formed by electroless plating or a sputtering film layer formed by sputtering using copper as a target. The electrolytic plating film layer (22*ep*) can be an electrolytic copper plating film layer formed using the metal film layer (22*np*) as a power feeding layer.

As illustrated, the surface roughness of the upper surfaces of the first conductor layers 12 is smaller than the surface roughness of the upper surfaces of the second conductor layers 22. Specifically, the arithmetic mean roughness of the upper surfaces of the first conductor layers 12 can be smaller than the arithmetic mean roughness of the upper surfaces of the second conductor layers 22 of the second wiring part 20. For example, the arithmetic mean roughness of the upper surfaces of the second conductor layers 22 can be 0.15 μm or more, and the arithmetic mean roughness of the upper surfaces of the first conductor layers 12 can be 0.13 μm or less. For example, for wirings having relatively highly roughened surfaces, in transmission of high frequency signals, transmission characteristics may deteriorate due to a substantial increase in impedance due to a skin effect. Since the upper surfaces of the first conductor layers 12 have a relatively low roughness, good transmission characteristics may be realized in the wirings (FW1) included in the first conductor layers 12, which can be responsible for transmitting high-frequency signals.

As described above, the first wirings (FW1) that can be included in the first conductor layers 12 can be responsible for transmitting high frequency signals. Further, the second wirings (FW2) that can be included in the second conductor layers 22 can be formed as finer and denser wirings compared to the first wirings (FW1). Therefore, by adopting a structure in which the surface roughness of the upper surfaces of the first conductor layers 12 is smaller than the surface roughness of the upper surfaces of the second conductor layers 22 and adopting a structure in which the surface roughness of the upper surfaces of the second insulating layers 21 is smaller than the surface roughness of the upper surfaces of the first insulating layers 11, the first conductor layers 12 can have a structure that is suitable for transmitting signals of higher frequencies and the second conductor layers 22 can have a structure that is suitable for a finer and denser structure.

An organic coating film layer (not illustrated) may be interposed between the upper surface of a first conductor layer 12 with relatively low roughness and a first insulating layer 11 laminated on the first conductor layer 12. The organic coating film layer that can be interposed between the upper surface of the first conductor layer 12 and the first insulating layer 11 can improve adhesion between the first conductor layer 12 and the first insulating layer 11. The organic coating film layer can be formed of a material that can bond to both an organic material such as a resin forming the first insulating layers 11 and an inorganic material such as a metal forming the first conductor layers 12. The organic coating film layer is formed of, for example, a material that contains both a reactive group capable of chemically bonding to an organic material and a reactive group capable of chemically bonding to an inorganic material. An example of the material for the organic coating film layer is a silane coupling agent containing an azole silane compound such as a triazole compound.

Further, as described above, dimensions of inorganic filler particles that can be contained in the second insulating layers 21 can be different from dimensions of inorganic filler particles that can be contained in the first insulating layers 11. Specifically, in particular, a maximum particle size of inorganic filler particles (f2) that can be contained in the second insulating layers 21 of the second wiring part 20 may be smaller than a maximum particle size of inorganic filler particles (f1) contained in the first insulating layers 11 of the first wiring part 10. In the second conductor layers 22 that can be formed at a relatively high density, when inorganic filler particles having relatively large particle sizes are positioned between adjacent conductors, a short circuit between wirings may occur due to migration via surfaces of the filler particles. Therefore, since a maximum particle size of the filler particles that can be contained in the second insulating layers 21 is relatively small, it may be possible that the risk of a short circuit in the second conductor layers 22 is reduced. The term "particle size" in the description of filler particles means a linear distance between two most distant points on an outer surface of a filler particle.

Specifically, for example, the maximum particle size of the inorganic filler particles (f2) that can be contained in the second insulating layers 21 can be 1 μm or less. For example, the maximum particle size of the inorganic filler particles (f1) that can be contained in the first insulating layers 11 can be 3 μm or more. The relatively small maximum particle size of the inorganic filler particles (f2) that can be contained in the second insulating layers 21 can contribute to the above-described relatively small arithmetic mean roughness of the upper surfaces of the second insulating layers 21. Since the particle sizes of the inorganic filler particles (f2) positioned near the upper surfaces of the second insulating layers 21 are relatively small, the upper surfaces of the second insulating layers 21 can be formed as surfaces having relatively small roughness.

The first conductor layers 12 can include the wirings (FW1) that can be responsible for transmitting high frequency signals. When an insulating layer in contact with a wiring has relatively high permittivity and dielectric loss tangent, a dielectric loss (transmission loss) of a high frequency signal transmitted via the wiring is relatively large. Therefore, from a point of view of realizing a good signal transmission quality for a signal transmitted by the first conductor layers 12, it is particularly desirable that the relative permittivity and dielectric loss tangent of the first insulating layers 11 are relatively small. The relative permittivity and dielectric loss tangent of the first insulating layers 11 may be different from the relative permittivity and dielectric loss tangent of the second insulating layers 21 of the second wiring part 20. The first insulating layers 11 are preferably formed of a material having relatively small permittivity and dielectric loss tangent, and preferably have, at a frequency of 5.8 GHz, a relative permittivity of 3.5 or less and a dielectric loss tangent of 0.005 or less.

The wiring substrate of the embodiment is not limited to those having the structures illustrated in FIGS. 1 and 2 and those having the structures, shapes, and materials exemplified herein. For example, the first wiring part of the wiring substrate may be a coreless substrate that does not include a core substrate. Further, the wiring parts can each have any number of insulating layers and any number of conductor layers. In the description of the embodiment, an example is illustrated in which the third wiring part 30 having the same structure as the second wiring part 20 is formed on the first wiring part 10 on the opposite side with respect to the side where the second wiring part 20 is formed. However, the structure of the third wiring part 30 (including the number of the insulating layers 31 and the number of the conductor layers 32, the conductor patterns of the conductor layers 32, the thicknesses and surface conditions of the insulating layers 31 and the conductor layers 32, and the like) is not particularly limited. A wiring part in any form can be formed on the first wiring part 10 on the opposite side with respect to the side where the second wiring part 20 is formed.

Next, with reference to FIGS. 3A-3G, a method for manufacturing a wiring substrate is described using a case where the wiring substrate 1 illustrated in FIG. 1 is manufactured as an example.

Figure 3A:
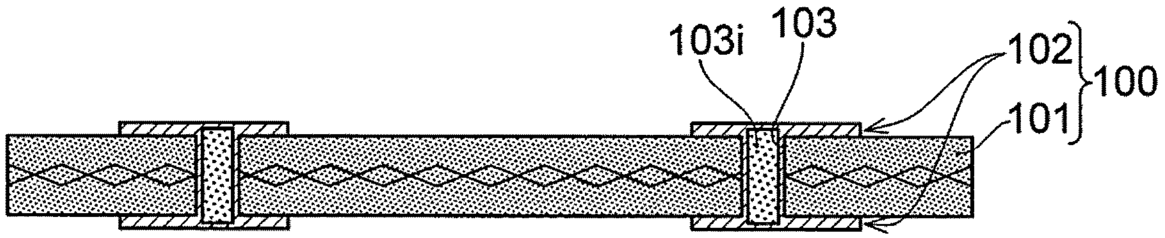
FIG. 3A is a cross-sectional view illustrating a method for manufacturing a wiring substrate according to an embodiment of the present invention.

First, as illustrated in FIG. 3A, the core substrate 100 is prepared. In the preparation of the core substrate 100, for example, a double-sided copper-clad laminated plate including the core insulating layer 101 is prepared. Through holes are formed in the double-sided copper-clad laminated plate, for example, by drilling. For example, an electroless plating film layer is formed on inner walls of the through holes and on the upper surface of the metal foil, and an electrolytic plating film layer is formed on the electroless plating film layer using the electroless plating film layer as a power feeding layer. As a result, although illustrated as having a single-layer structure in the drawings, the through-hole conductors 103 are formed that have a multilayer structure including the electroless plating film layer and the electrolytic plating film layer and cover the inner walls of the through holes. The insides of the through-hole conductors 103 are filled with the resin bodies (103*i*) by injecting, for example, an epoxy resin into the inner sides of the through-hole conductors 103. After the filling resin bodies (103*i*) are solidified, on the resin bodies (103*i*) and the upper surface of the electrolytic plating film layer, an electroless plating film layer and an electrolytic plating film layer are further formed. As a result, although illustrated as each having a single-layer structure, the conductor layers 102 each having a five-layer structure including the metal foil layer, the electroless plating film layer, the electrolytic plating film layer, the electroless plating film layer, and the electrolytic plating film layer are respectively formed on both sides of the insulating layer 101. Then, the core substrate 100 having predetermined conductor patterns is obtained by patterning the conductor layers 102 using a subtractive method.

Figure 3B:
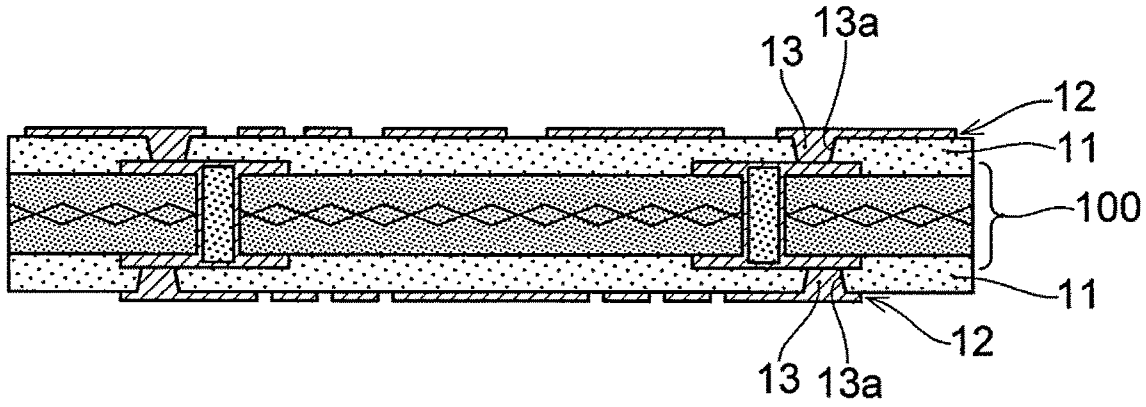
FIG. 3B is a cross-sectional view illustrating a method for manufacturing a wiring substrate according to an embodiment of the present invention.

Next, as illustrated in FIG. 3B, an insulating layer 11 is formed on each of both sides of the core substrate 100, and a conductor layer 12 is formed on the insulating layer 11. For example, each insulating layer 11 is formed by thermocompression bonding a film-like insulating resin onto the core substrate 100. The conductor layer 12 is formed using any method for forming conductor patterns, such as a semi-additive method, at the same time as the via conductors 13 filling openings (13*a*) that can be formed in the insulating layer 11, for example, using laser. After the formation of the openings (13*a*) using laser, a desmear treatment can be performed in which resin residues that can remain in the openings (13*a*) are removed. The desmear treatment can be performed, for example, by a plasma treatment with $CF_4$ or $CF_4$+$O_2$, or by a wet treatment using a chemical solution containing an oxidizing agent such as permanganate. The desmear treatment removes resin residues that can remain in the openings (13*a*) and can roughen the upper surface of the insulating layer 11.

Figure 3C:
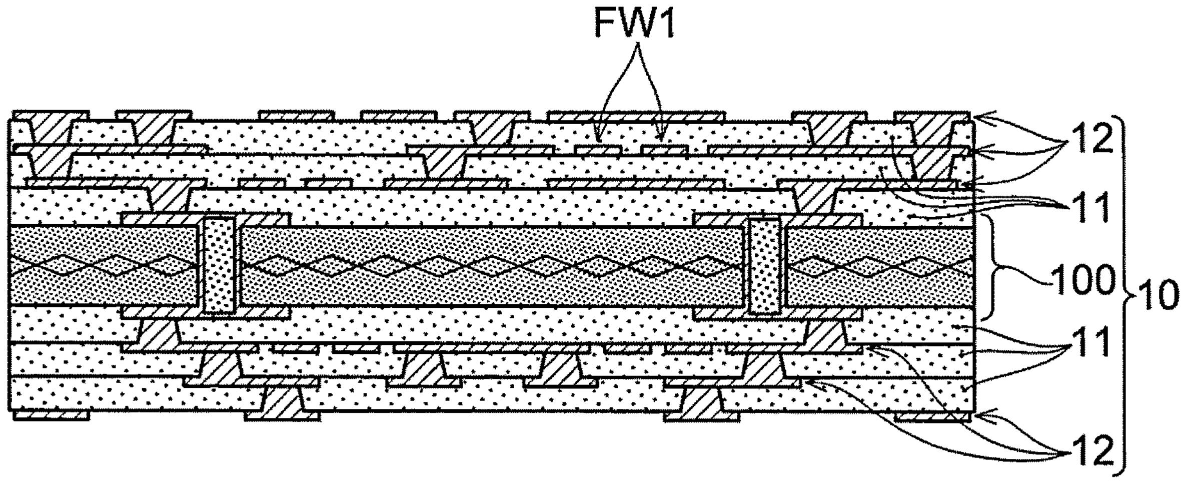
FIG. 3C is a cross-sectional view illustrating a method for manufacturing a wiring substrate according to an embodiment of the present invention.

Subsequently, as illustrated in FIG. 3C, on each of both sides of the core substrate 100, the lamination of an insulating layer 11 and a conductor layer 12 is further repeated a necessary number of times, and the first wiring part 10 is formed. In the illustrated example, the conductor layers 12 are formed to include the wirings (FW1) as the conductor patterns.

In the formation of the insulating layers 11 described with reference to FIGS. 3A-3C, as a material of the insulating layers 11, for example, a material having a relative permittivity of 3.5 or less and a dielectric loss tangent of 0.005 or less at a frequency of 5.8 GHz can be used. Further, as a material of the insulating layers 11, a material containing inorganic filler particles having a maximum particle size of 0.3 μm or more may be used. The insulating layers 11 to be formed can each be formed using a resin film having a minimum thickness of 19 μm or more. The upper surfaces of the insulating layers 11 to be formed (the surfaces on which the conductor layers 12 are respectively laminated) can be formed to have a surface roughness of, for example, 0.15 μm or more in terms of arithmetic mean roughness by adjusting treatment conditions of the desmear treatment described above.

Further, the formation of each of the conductor layers 12 can include a process of forming unevenness on the surface of the each of the conductor layers 12 by a surface treatment using a chemical solution containing an organic acid-based micro-etching agent. The surface roughness of the upper surface of each of the conductor layers 12 can be adjusted as appropriate depending on a composition of the chemical solution to be used and treatment conditions. For example, the upper surface of each of the conductor layers 12 can be formed to have an arithmetic mean roughness (Ra) of 0.13 μm or less. The conductor layers 12 to be formed can be formed, for example, to have a thickness of 12 μm or more.

Further, in the formation of the conductor layers 12, an organic coating film layer (not illustrated) may be formed on the upper surface of each of the conductor layers 12 to be formed. For example, the organic coating film layer improves adhesion between each of the conductor layers 12 and the insulating layer laminated on the each of the conductor layers 12. The organic coating film layer can be formed, for example, by immersion of each of the conductor layers 12 in a liquid containing a material such as a silane coupling agent that can bind to both an organic material and inorganic material, or by spraying of such a liquid.

Figure 3D:
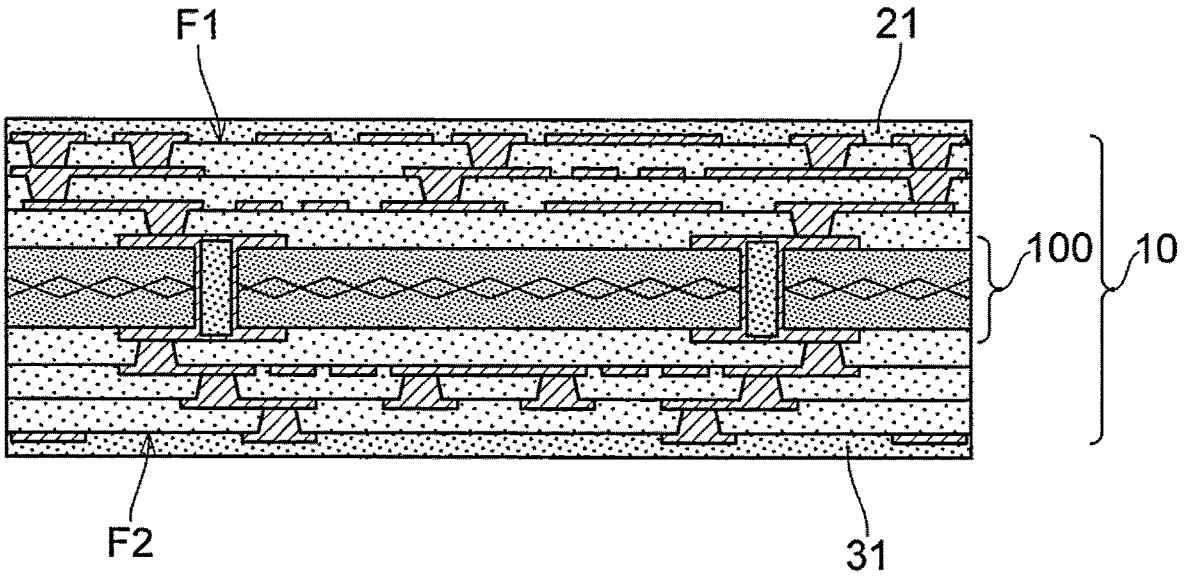
FIG. 3D is a cross-sectional view illustrating a method for manufacturing a wiring substrate according to an embodiment of the present invention.

Next, as illustrated in FIG. 3D, an insulating layer 21 is formed on an outer side of the surface (F1) on one side of the first wiring part 10, and an insulating layer 31 is formed on an outer side of the surface (F2) on the other side of the first wiring part 10. The insulating layers (21, 31) can each be formed, for example, by thermocompression bonding a resin film.

Figure 3E:
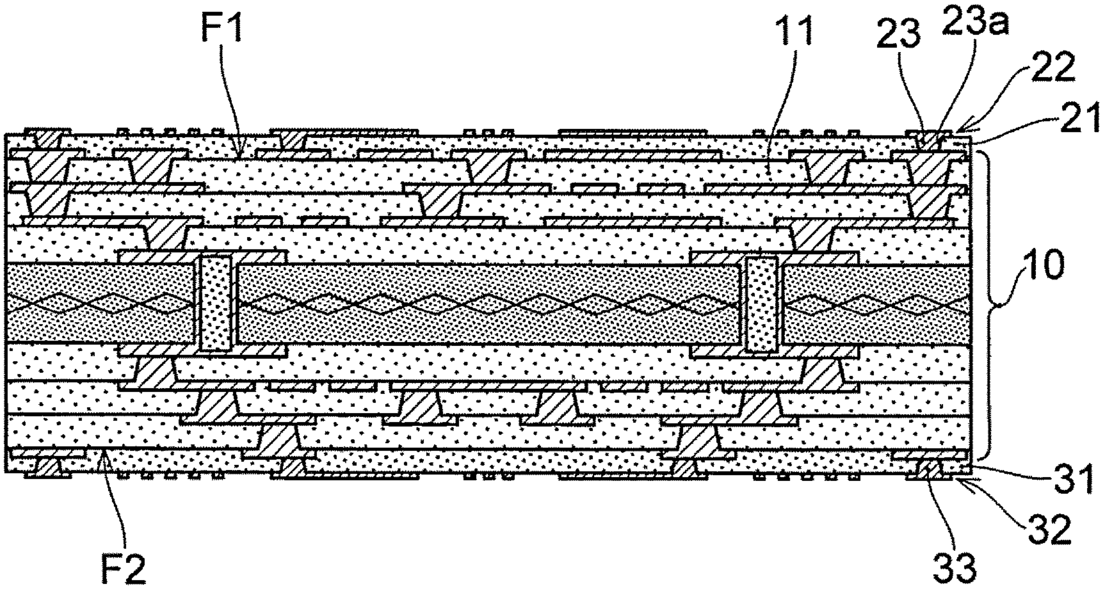
FIG. 3E is a cross-sectional view illustrating a method for manufacturing a wiring substrate according to an embodiment of the present invention.

Next, as illustrated in FIG. 3E, a conductor layer 22 is integrally formed with via conductors 23 on the insulating layer 21. A conductor layer 32 is integrally formed with via conductors 33 on the insulating layer 31. The conductor layer 22 is formed using any method for forming conductor patterns, such as a semi-additive method, at the same time as the via conductors 23 filling openings (23*a*) that can be formed in the insulating layer 21, for example, using laser. After the formation of the openings (23*a*) using laser, a desmear treatment can be performed in which resin residues that can remain in the openings (23*a*) are removed. Similar to the treatment that can be performed on the insulating layers 11, the desmear treatment can be performed, for example, by a plasma treatment or a treatment using a chemical solution. The desmear treatment removes resin residues that can remain in the openings (23*a*) and can roughen the upper surface of the insulating layer 21.

Figure 3F:
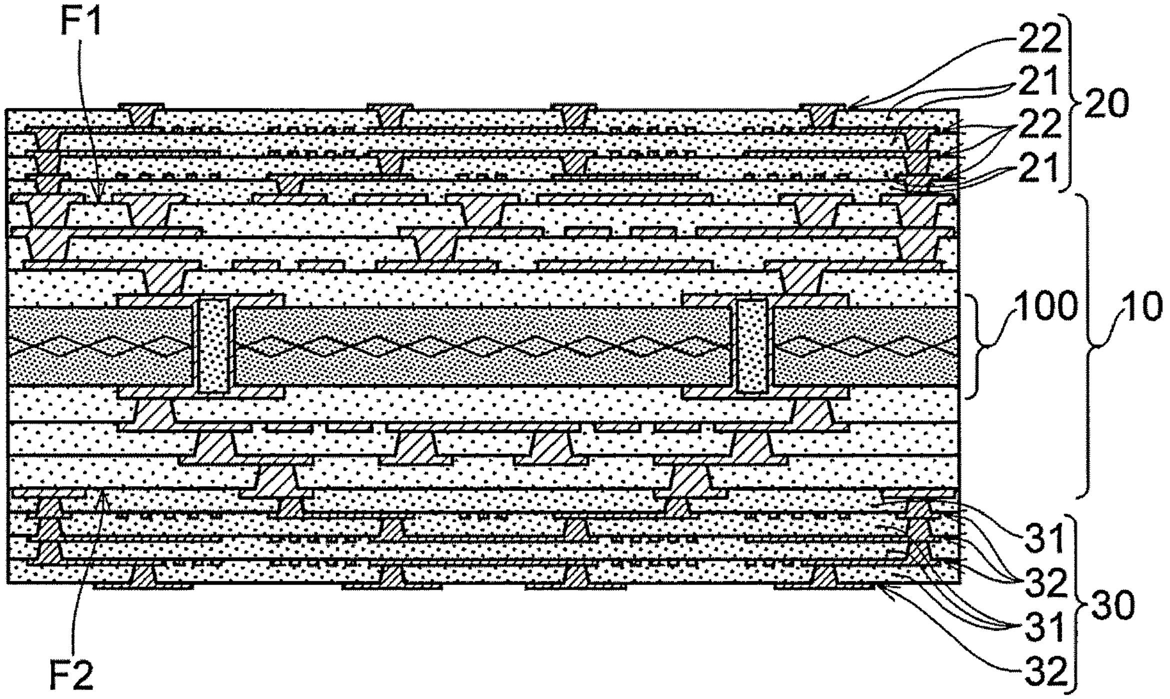
FIG. 3F is a cross-sectional view illustrating a method for manufacturing a wiring substrate according to an embodiment of the present invention.

Subsequently, as illustrated in FIG. 3F, on the surface (F1) side of the first wiring part 10, the formation of an insulating layer 21 and a conductor layer 22 is repeated a desired number of times, and on the surface (F2) side, the formation of an insulating layer 31 and a conductor layer 32 is repeated a desired number of times. The formation of the second wiring part 20 and the third wiring part 30 is completed.

In particular, in the formation of the insulating layers 21 of the second wiring part 20, the insulating layers 21 are formed to each have a thickness smaller than the thickness of each of the insulating layers 11. For example, as described above, when the insulating layers 11 are formed to each have a thickness of 19 μm or more, the insulating layers 21 can each be formed using a resin film having a maximum thickness of 18 μm or less. Further, in the formation of the insulating layers 21, when the insulating layers 21 are formed using a material containing inorganic filler particles, a material containing inorganic filler particles having a maximum particle size of 1 μm or less can be used. Further, as described above, when the surface roughness of the upper surfaces of the insulating layers 11 is, for example, 0.15 μm or more in terms of arithmetic mean roughness, the upper surfaces of the insulating layers 21 to be formed (the surfaces on which the conductor layers 22 are respectively laminated) can be formed to have a surface roughness of, for example, 0.13 μm or less in terms of arithmetic mean roughness by adjusting treatment conditions of the desmear treatment.

Further, in particular, in the formation of the conductor layers 22, the conductor layers 22 can be formed to each have a thickness smaller the thickness of each of the conductor layers 12. For example, as described above, when the conductor layers 12 are formed to each have a minimum thickness of 12 μm or more, the conductor layers 22 can be formed to each have a maximum thickness of 11 μm or less. The outermost conductor layer 22 in the second wiring part 20 is formed in a pattern including the multiple conductor pads (22*p*). The upper surfaces of the conductor layers 22 to be formed can have an arithmetic mean roughness (Ra) of 0.15 μm or more.

Figure 3G:
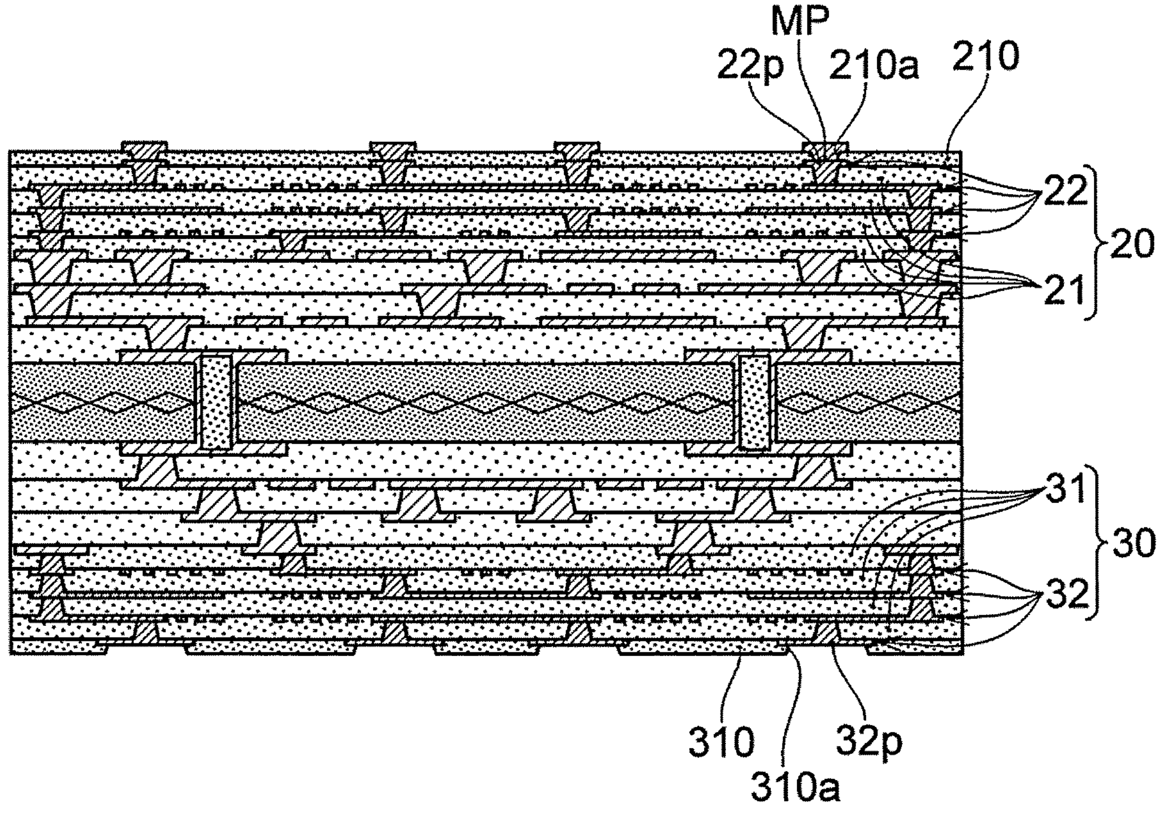
FIG. 3G is a cross-sectional view illustrating a method for manufacturing a wiring substrate according to an embodiment of the present invention.

Next, as illustrated in FIG. 3G, the covering insulating layer 210 is formed on the outermost conductor layer 22 in the second wiring part 20 and on the insulating layer 21 exposed from the patterns of the conductor layer 22. The openings (210*a*) exposing the conductor pads (22*p*) are formed in the covering insulating layer 210. For example, the covering insulating layer 210 can be formed by forming a photosensitive epoxy resin film by spray coating, curtain coating, film pasting, or the like, and the openings (210*a*) can be formed by exposure and development. On the outer side of the third wiring part 30, using the same method as the formation of the covering insulating layer 210, the covering insulating layer 310 having the openings (310*a*) exposing the conductor pads (32*p*) is formed on the conductor layer 32 and on the insulating layer 31 exposed from the patterns of the conductor layer 32.

Subsequently, the openings (210*a*) are filled with conductors, and the connection elements (MP) are formed on the conductor pads (22*p*). The connection elements (MP) can be formed, for example, using a semi-additive method. The formation of the second wiring part 20 is completed, and the formation of the wiring substrate 1 is completed. In the process of forming the connection elements (MP), the surface of the covering insulating layer 310 and the upper surfaces of the conductor pads (32*p*) exposed from the openings (310*a*) can be appropriately protected by arranging a protective plate of PET or the like.

In a wiring substrate described in Japanese Patent Application Laid-Open Publication No. 2014-225632, a second wiring member, which is a high-density wiring layer, is formed on an outer side of a first wiring member, which is a low-density wiring layer.

In the wiring substrate described in Japanese Patent Application Laid-Open Publication No. 2014-225632, it is thought that transmission characteristics of wiring layers in the wiring members may not be suitable for signals to be carried.

A wiring substrate according to an embodiment of the present invention includes a first wiring part and a second wiring part. The first wiring part includes: a first insulating layer; and a first conductor layer laminated on the first insulating layer. The second wiring part is formed on the first wiring part and includes: a second insulating layer having a thickness smaller than a thickness of the first insulating layer; and a second conductor layer that is laminated on the second insulating layer and has a thickness smaller than a thickness of the first conductor layer. An arithmetic mean roughness of a surface of the first conductor layer on the opposite side with respect to the first insulating layer is smaller than an arithmetic mean roughness of a surface of the second conductor layer on the opposite side with respect to the second insulating layer. The second wiring part is closer to an outermost surface of the wiring substrate than the first wiring part is.

According to an embodiment of the present invention, it is thought that a wiring substrate is provided that includes, in each wiring part, a conductor layer having transmission characteristics more suitable for signals to be carried.

Obviously, numerous modifications and variations of the present invention are possible in light of the above teachings. It is therefore to be understood that within the scope of the appended claims, the invention may be practiced otherwise than as specifically described herein.

The invention claimed is:

1. A wiring substrate, comprising:

a first wiring part comprising a first insulating layer and a first conductor layer laminated on the first insulating layer such that the first conductor layer includes a plurality of wirings configured to transmit high frequency signal; and a second wiring part formed on the first wiring part and comprising a second insulating layer and a second conductor layer laminated on the second insulating layer such that a thickness of the second insulating layer is smaller than a thickness of the first insulating layer and that a thickness of the second conductor layer is smaller than a thickness of the first conductor layer, wherein the first conductor layer in the first wiring part has a surface on an opposite side with respect to the first insulating layer such that an arithmetic mean roughness of the surface is smaller than an arithmetic mean roughness of a surface of the second conductor layer on an opposite side with respect to the second insulating layer, and the second wiring part is formed such that the second wiring part is positioned closer to an outermost surface of the wiring substrate than the first wiring part.

2. The wiring substrate according to claim 1, wherein the second insulating layer has a surface on which the second conductor layer is laminated such that the surface of the second insulating layer has an arithmetic mean roughness that is smaller than an arithmetic mean roughness of a surface of the first insulating layer on which the first conductor layer is laminated.

3. The wiring substrate according to claim 2, wherein the first conductor layer is formed in the first wiring part such that the arithmetic mean roughness of the surface on the opposite side with respect to the first insulating layer is 0.13 μm or less.

4. The wiring substrate according to claim 2, wherein the second wiring part is formed such that a thickness of the second conductor layer is set to 11 μm or less.

5. The wiring substrate according to claim 2, wherein the first and second wiring parts are formed such that each of the first insulating layer and the second insulating layer include inorganic filler particles and that a maximum particle size of the inorganic filler particles in the second insulating layer is smaller than a maximum particle size of the inorganic filler particles in the first insulating layer.

6. The wiring substrate according to claim 5, wherein the second wiring part is formed such that the maximum particle size of the inorganic filler particles in the second insulating layer is set to 1 μm or less.

7. The wiring substrate according to claim 2, wherein the first wiring part includes an organic coating film layer covering the surface of the first conductor layer on the opposite side with respect to the first insulating layer.

8. The wiring substrate according to claim 2, wherein the first and second wiring parts are formed such that a dielectric loss tangent of the first insulating layer is smaller than a dielectric loss tangent of the second insulating layer at a frequency of 5.8 GHz and that a relative permittivity of the first insulating layer is smaller than a relative permittivity of the second insulating layer at a frequency of 5.8 GHz.

9. The wiring substrate according to claim 8, wherein the first wiring part is formed such that the first insulating layer has the dielectric loss tangent of 0.005 or less and the relative permittivity of 3.5 or less at a frequency of 5.8 GHz.

10. The wiring substrate according to claim 1, wherein the first conductor layer is formed in the first wiring part such that the arithmetic mean roughness of the surface on the opposite side with respect to the first insulating layer is 0.13 μm or less.

11. The wiring substrate according to claim 10, wherein the first and second wiring parts are formed such that each of the first insulating layer and the second insulating layer include inorganic filler particles and that a maximum particle size of the inorganic filler particles in the second insulating layer is smaller than a maximum particle size of the inorganic filler particles in the first insulating layer.

12. The wiring substrate according to claim 11, wherein the second wiring part is formed such that the maximum particle size of the inorganic filler particles in the second insulating layer is set to 1 μm or less.

13. The wiring substrate according to claim 10, wherein the first wiring part includes an organic coating film layer covering the surface of the first conductor layer on the opposite side with respect to the first insulating layer.

14. The wiring substrate according to claim 10, wherein the first and second wiring parts are formed such that a dielectric loss tangent of the first insulating layer is smaller than a dielectric loss tangent of the second insulating layer at a frequency of 5.8 GHz and that a relative permittivity of the first insulating layer is smaller than a relative permittivity of the second insulating layer at a frequency of 5.8 GHz.

15. The wiring substrate according to claim 1, wherein the second wiring part is formed such that a thickness of the second conductor layer is set to 11 μm or less.

16. The wiring substrate according to claim 1, wherein the first and second wiring parts are formed such that each of the first insulating layer and the second insulating layer include inorganic filler particles and that a maximum particle size of the inorganic filler particles in the second insulating layer is smaller than a maximum particle size of the inorganic filler particles in the first insulating layer.

17. The wiring substrate according to claim 16, wherein the second wiring part is formed such that the maximum particle size of the inorganic filler particles in the second insulating layer is set to 1 μm or less.

18. The wiring substrate according to claim 1, wherein the first wiring part includes an organic coating film layer covering the surface of the first conductor layer on the opposite side with respect to the first insulating layer.

19. The wiring substrate according to claim 1, wherein the first and second wiring parts are formed such that a dielectric loss tangent of the first insulating layer is smaller than a dielectric loss tangent of the second insulating layer at a frequency of 5.8 GHz and that a relative permittivity of the first insulating layer is smaller than a relative permittivity of the second insulating layer at a frequency of 5.8 GHz.

20. The wiring substrate according to claim 19, wherein the first wiring part is formed such that the first insulating layer has the dielectric loss tangent of 0.005 or less and the relative permittivity of 3.5 or less at a frequency of 5.8 GHz.

* * * * *